(12) United States Patent
Huang et al.

(10) Patent No.: US 9,793,458 B2
(45) Date of Patent: *Oct. 17, 2017

(54) LIGHT-EMITTING DEVICE AND METHOD OF MANUFACTURING THEREOF

(71) Applicant: EPISTAR CORPORATION, Hsinchu (TW)

(72) Inventors: Chien-Fu Huang, Hsinchu (TW); Yao-Ning Chan, Hsinchu (TW); Tzu Chieh Hsu, Hsinchu (TW); Yi Ming Chen, Hsinchu (TW); Hsin-Chih Chiu, Hsinchu (TW); Chih-Chiang Lu, Hsinchu (TW); Chia-Liang Hsu, Hsinchu (TW); Chun-Hsien Chang, Hsinchu (TW)

(73) Assignee: EPISTAR CORPORATION, Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/438,430

(22) Filed: Feb. 21, 2017

(65) Prior Publication Data

US 2017/0170375 A1 Jun. 15, 2017

Related U.S. Application Data

(63) Continuation of application No. 14/902,795, filed as application No. PCT/CN2013/078923 on Jul. 5, 2013, now Pat. No. 9,614,127.

(51) Int. Cl.
*H01L 33/00* (2010.01)
*H01L 33/62* (2010.01)
(Continued)

(52) U.S. Cl.
CPC ............ *H01L 33/62* (2013.01); *H01L 25/167* (2013.01); *H01L 33/0079* (2013.01);
(Continued)

(58) Field of Classification Search
None
See application file for complete search history.

(56) References Cited

U.S. PATENT DOCUMENTS

| | | |
|---|---|---|
| 2010/0317132 A1 | 12/2010 | Rogers et al. |
| 2012/0055532 A1 | 3/2012 | Wang et al. |
| 2012/0320581 A1 | 12/2012 | Rogers et al. |

FOREIGN PATENT DOCUMENTS

| | | |
|---|---|---|
| CN | 1336027 A | 2/2002 |
| CN | 1728410 A | 2/2006 |

(Continued)

*Primary Examiner* — Cheung Lee
(74) *Attorney, Agent, or Firm* — Patterson + Sheridan, LLP

(57) ABSTRACT

The present disclosure provides a method of manufacturing a light-emitting device, which comprises providing a first substrate and a plurality of semiconductor stacked blocks on the first substrate, and each of the plurality semiconductor stacked blocks comprises a first conductive-type semiconductor layer, a light-emitting layer on the first conductive-type semiconductor layer, and a second conductive-type semiconductor layer on the light-emitting layer; wherein there is a trench separating two adjacent semiconductor stacked blocks on the first substrate, and a width of the trench is less than 10 μm; and conducting a first separating step to separate a first semiconductor stacked block of the plurality of semiconductor stacked blocks from the first substrate and keep a second semiconductor stacked block on the first substrate.

20 Claims, 17 Drawing Sheets

(51) Int. Cl.
*H01L 33/38* (2010.01)
*H01L 25/16* (2006.01)

(52) U.S. Cl.
CPC ...... *H01L 33/38* (2013.01); *H01L 2933/0016* (2013.01); *H01L 2933/0066* (2013.01)

(56) References Cited

FOREIGN PATENT DOCUMENTS

| | | |
|---|---|---|
| CN | 101740494 B | 8/2012 |
| CN | 102891221 A | 1/2013 |
| JP | 2011071273 A | 4/2011 |
| TW | 201023243 A | 6/2010 |
| TW | 201212279 A | 3/2012 |

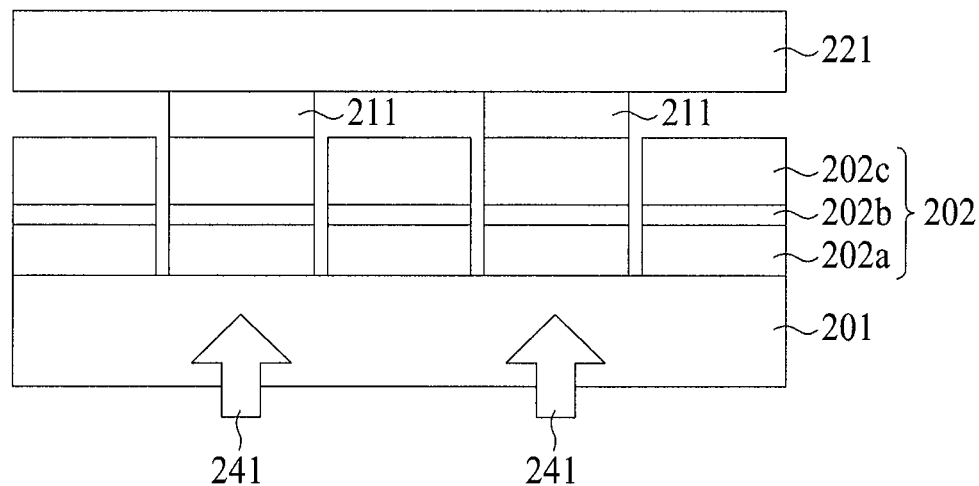
FIG. 2D
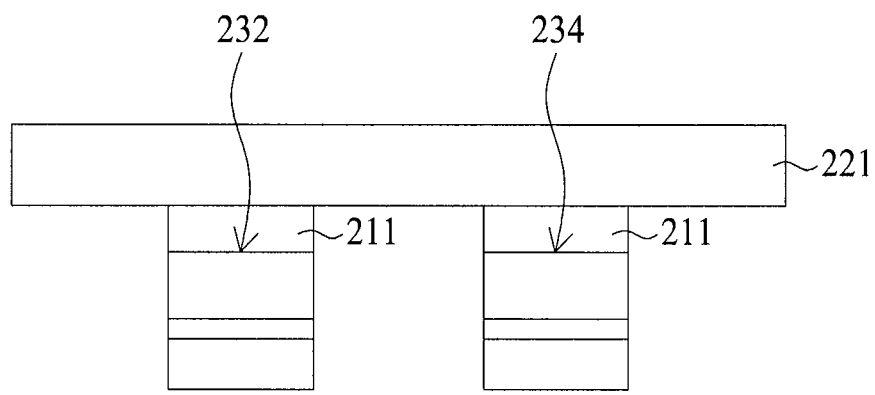
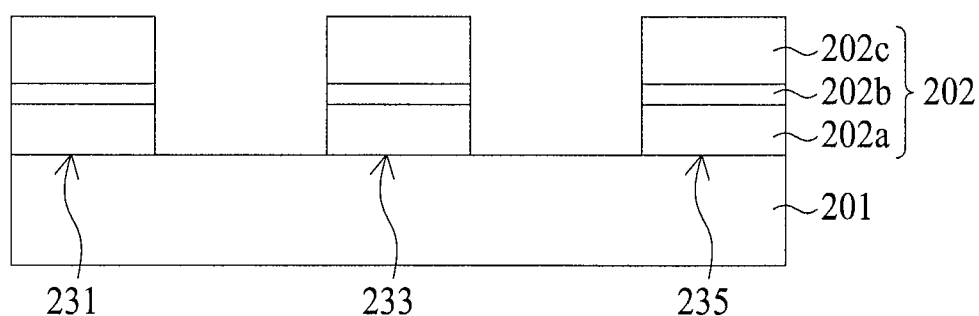
FIG. 2E

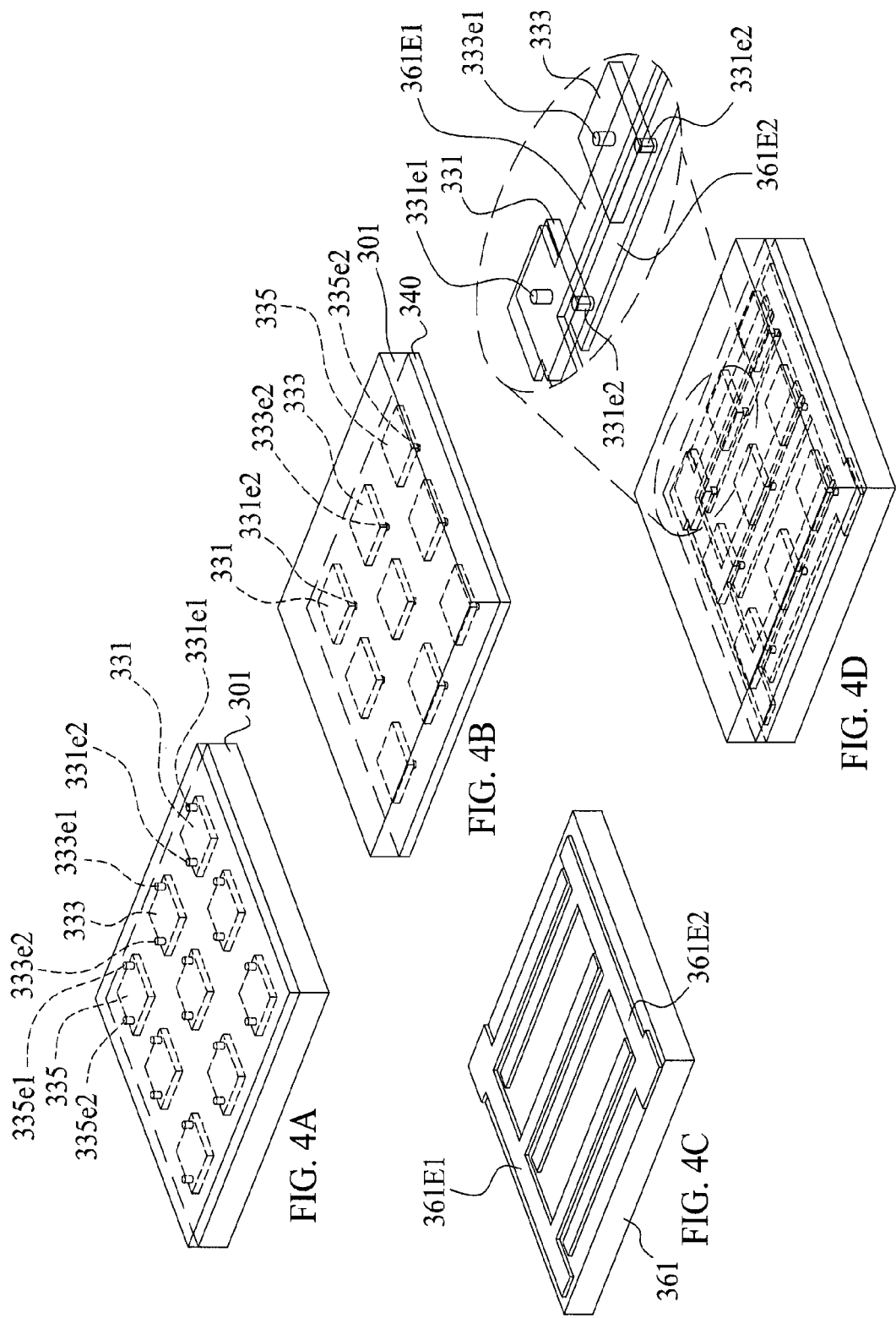

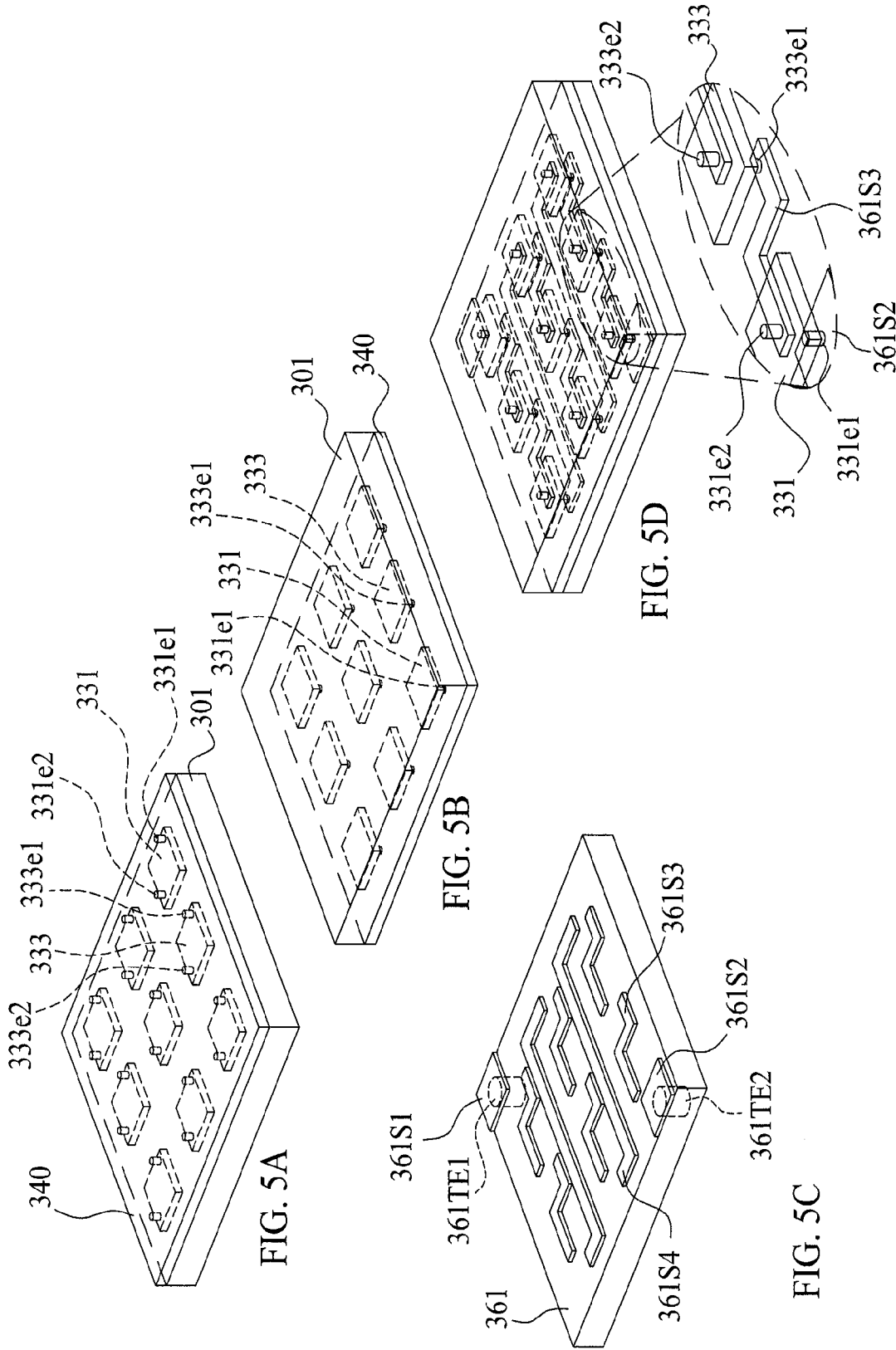

US 9,793,458 B2

LIGHT-EMITTING DEVICE AND METHOD OF MANUFACTURING THEREOF

CROSS-REFERENCE TO RELATED APPLICATIONS

This application is a continuation of U.S. patent application Ser. No. 14/902,795, filed Jul. 5 2013, which is incorporated by reference in its entirety.

TECHNICAL FIELD

This present disclosure relates to a light-emitting device and the method of manufacturing thereof, and more particularly to a light-emitting device with higher utilizing efficiency of a light-emitting stack and the method of manufacturing thereof.

DESCRIPTION OF BACKGROUND ART

Light-emitting diode (LED) has low power consumption, long operation lifetime, shack-proof, compact size, fast reacting rate and stable light-emitting wavelength and so on, and therefore LED is suitable for various lighting purposes. As shown in FIG. 1, the conventional method of manufacturing the LED chip comprises forming a light-emitting stack (not shown) on a substrate 101, and forming cutting trenches 103v, 103h to separate the light-emitting stack and produce a plurality of LED chips 102. However, because most of the conventional LED chips are produced by laser-cutting which might produce byproducts when cutting the light-emitting stack due to the limitation of the laser beam size, the byproducts could cause current leakage easily. As a result, a width D of the cutting trenches 103v, 103h must maintain at least 20 μm to avoid the above mentioned situations. Nevertheless, if the areas of the cutting trenches can be optimized, the utilized area of the light-emitting stack can be increased by 25%.

SUMMARY OF THE DISCLOSURE

The present disclosure provides a method of manufacturing a light-emitting device, which comprises providing a first substrate and a plurality of semiconductor stacked blocks on the first substrate, and each of the plurality semiconductor stacked blocks comprises a first conductive-type semiconductor layer, a light-emitting layer on the first conductive-type semiconductor layer, and a second conductive-type semiconductor layer on the light-emitting layer; wherein there is a trench separating two adjacent semiconductor stacked blocks on the first substrate, and a width of the trench is less than 10 μm; and conducting a first separating step to separate a first semiconductor stacked block of the plurality of semiconductor stacked blocks from the first substrate and keep a second semiconductor stacked block on the first substrate.

BRIEF DESCRIPTION OF THE DRAWINGS

FIGS. 2A-2E show a separating method of the method of manufacturing the light-emitting device in accordance with one embodiment of the present disclosure.

FIG. 4A-4D show the method of manufacturing the light-emitting device in accordance with the first embodiment of the present disclosure (parallel connection).

FIG. 5A-5D show the method of manufacturing the light-emitting device in accordance with the first embodiment of the present disclosure (series connection).

DETAILED DESCRIPTION OF THE PRESENT DISCLOSURE

Figure 1:
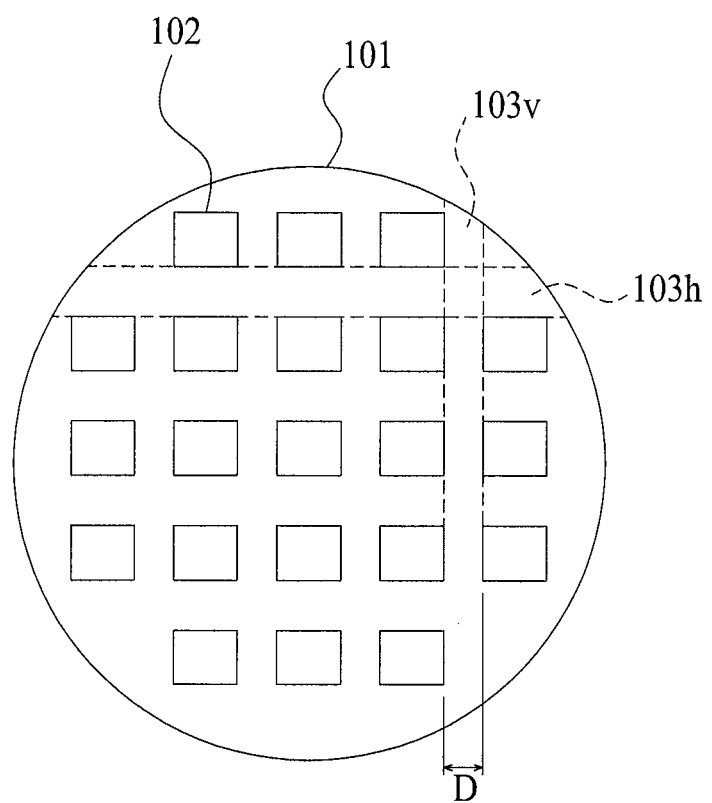
FIG. 1 shows the substrate utilized to produce the conventional LED chips.

The embodiments of the application are illustrated in details, and are plotted in the drawings. The same or the similar parts are illustrated in the drawings and the specification with the same reference numeral.

FIGS. 2A-2E show a separating method of the method of manufacturing the light-emitting device in accordance with one embodiment of the present disclosure. FIGS. 3-5 show the method of manufacturing the light-emitting device in accordance with the first embodiment of the present disclosure, wherein FIGS. 3A-3F and FIG. 4 shows the light-emitting device formed by the plurality of the light-emitting stacked blocks in parallel connection. FIG. 5 shows the light-emitting device formed by the plurality of the light-emitting stacked blocks in series connection.

Figure 2A:
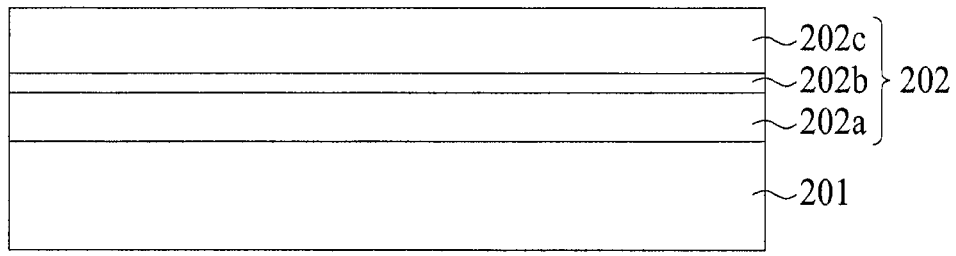
Figure 2B:
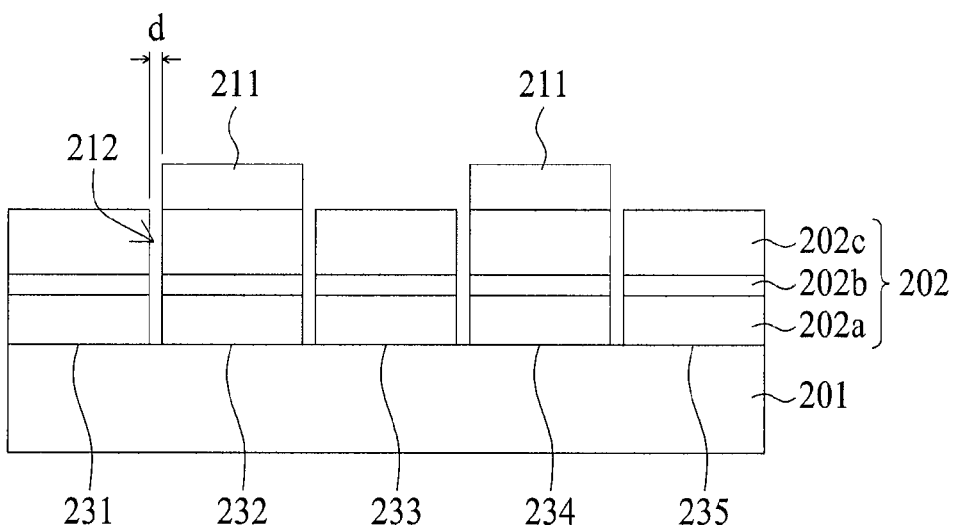
Figure 2C:
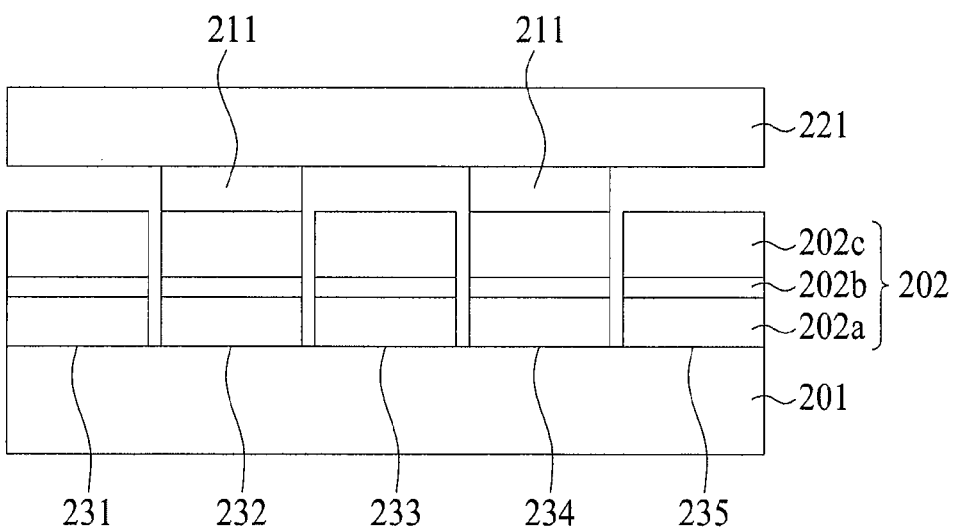

As shown in FIG. 2A, a semiconductor stack 202 is formed on the first substrate 201, and the semiconductor stack 202 comprises a first conductive-type semiconductor layer 202a, a light-emitting layer 202b on the first conductive-type semiconductor layer 202a, and a second conductive-type semiconductor layer 202c on the light-emitting layer 202b. The first conductive-type semiconductor layer 202a and the second conductive-type semiconductor layer 202c have different electrical properties, for example, the first conductive-type semiconductor layer 202a is n-type semiconductor layer and the second conductive-type semiconductor layer 202c is p-type semiconductor layer. The first conductive-type semiconductor layer 202a, the light-emitting layer 202b and the second conductive-type semiconductor layer 202c comprise III-V group material, such as AlGaInP series materials or AlGaInN series materials. As shown in FIG. 2B, conducting a patterning step to form a trench 212 having a width d, and the semiconductor stack 202 is patterned to form a plurality of semiconductor stacked blocks 231, 232, 233, 234 and 235, that is, the adjacent two semiconductor stacked blocks are separated by the trench 212. In order to increase the utilized area of the semiconductor stack 202, the width d of the trench could be as narrow as possible, for example, to be less than 20 μm, and preferable to be less than 10 μm. In one embodiment, the width d of the trench 212 is less than 5 μm. The foregoing "patterning" is a process comprises capping photoresist, photolithography and then etching. However, it is not limited to the method of patterning, and the other method, such as directly cutting the semiconductor stack 202 by laser is also a possible embodiment. Besides, each of the semiconductor stacked blocks has a top-view shape, and the top-view shape comprises a diamond, a square, a rectangle, a triangle or a circle. It should be noted that, the semiconductor stack 202 could grow on the first substrate 201, that is, the first substrate 201 is a growth substrate of the semiconductor stack 202. However, it-is possible that the semiconductor stack 202 is formed on other growth substrate, and then is transferred to the first substrate 201 by transferring technique. In the latter situation, there is an adhesive layer (not shown) between the semiconductor stack 202 and the first substrate 201. The transferring technique is a well-known knowledge for the person having ordinary skill in the art and it is unnecessary to explain in detail. In another embodiment, after the semiconductor stack 202 is formed on other growth substrate and then patterned to form the plurality of semiconductor stacked blocks 231, 232, 233, 234 and 235, the plurality of semiconductor stacked blocks 231, 232, 233, 234 and 235 are transferred to the first substrate 201 to form the structure shown in FIG. 2B. Similarly, it could further comprise an adhesive layer (not shown) between the semiconductor staked blocks 231, 232, 233, 234, 235 and the first substrate 201. After that, a first sacrificial layer 211 is formed to facilitate a separating step on the semiconductor stacked block which will be removed. In this embodiment, the semiconductor stacked blocks to be removed are the semiconductor stack blocks 232 and 234. The first sacrificial layer 211 could be formed by forming a layer of the material of the first sacrificial layer 211 on the surfaces of the plurality of the semiconductor stacked blocks, and then selectively removing the first sacrificial layer 211 on the semiconductor stack blocks 231,233 by lithography and etching process while keeping the first sacrificial layer 211 on the semiconductor stack blocks 232, 234 which will be removed in the following separating step. It should be noted that, the person having ordinary skill in the art realizes the order of the processes could be different from the above-mentioned situation. That is, the patterning process for patterning the semiconductor layer 202 to form the plurality of semiconductor stacks 231, 232, 233, 234 and 235 by a lithography or etching could be finished after forming the first sacrificial layer 211 on the positions of the semiconductor stacked blocks which will be removed in the following separating step (such as the positions on the semiconductor stacked blocks 232, 234 in the embodiment). The material of the first sacrificial layer 211 could be conductive material or insulating material. The conductive material could be, for example, metal oxide, metal or alloy, wherein the metal oxide could be indium tin oxide (ITO), indium oxide (InO), tin oxide (SnO), cadmium tin oxide (CTO), antimony tin oxide (ATO) or zinc oxide (ZnO); the metal could be Al, Au, Pt, Zn, Ag, Ni, Ge, In, Sb, Ti, Pb, Cu or Pd; and the alloy could be the alloy containing more than one of the foregoing metals. The insulating material could be, for example, polymer material, oxide or nitride ($SiN_x$), wherein the polymer material could be BCB, epoxy and so on; the oxide could be silicon oxide ($SiO_2$) and aluminum oxide ($Al_2O_3$); the nitride could be silicon nitride ($SiN_x$). The person having ordinary skill in the art could choose the material of the first sacrificial layer 211 based on the requirement of the following procedures and the electrical conductive property or the transparent property of the product. As shown in FIG. 2C, the separating step comprises providing a second substrate 221, and bonding the second substrate 221 to the first sacrificial layer 211 . The second substrate 221 could be a transparent substrate or an opaque substrate. The transparent substrate, for example, could be glass, sapphire ($Al_2O_3$), CVD diamond; the opaque substrate, for example, could be silicon substrate, aluminum nitride substrate or ceramic substrate. The person having ordinary skill in the art could choose the material of the second substrate 221 based on the requirement of the following procedures and the electrical conductive property or the transparent property of the product. And then, as shown in FIG. 2D, the semiconductor stacked blocks 232 and 234 which will be removed are separated from the first substrate 201. It is easier to separate the semiconductor stacked blocks 232, 234 from the first substrate 201 by irradiating a laser 241 to an interface between the first substrate 201 and the semiconductor stacked blocks 232, 234. As mentioned before, the light-emitting layer 202 could also be formed on other growth substrate and be transferred to the first substrate 201. In this situation, it could selectively form a sacrificial layer (not shown) at first between the first substrate 201 and the semiconductor stacked blocks 232, 234 which will be removed in the following separating step when transferring the semiconductor stack 202 to the first substrate 201. The material which is fragile or has weak bonding ability with the first substrate 201 could be chosen as the material of the first sacrificial layer 211, so that the semiconductor stacked blocks 232, 234 can be separated from the first substrate 201 easily.

FIG. 2E shows the semiconductor stacked blocks 232, 234 separated from the first substrate 201, while the semiconductor stacked blocks 231,233 are remained on the first substrate 201 after the separation process. It should be noted that either the second substrate 221 and the semiconductor stacked blocks 232, 234 thereon or the first substrate 201 and the semiconductor stacked blocks 231, 233, 235 thereon could be used in the following method of manufacturing the light-emitting device in the embodiment.

Figure 2F:
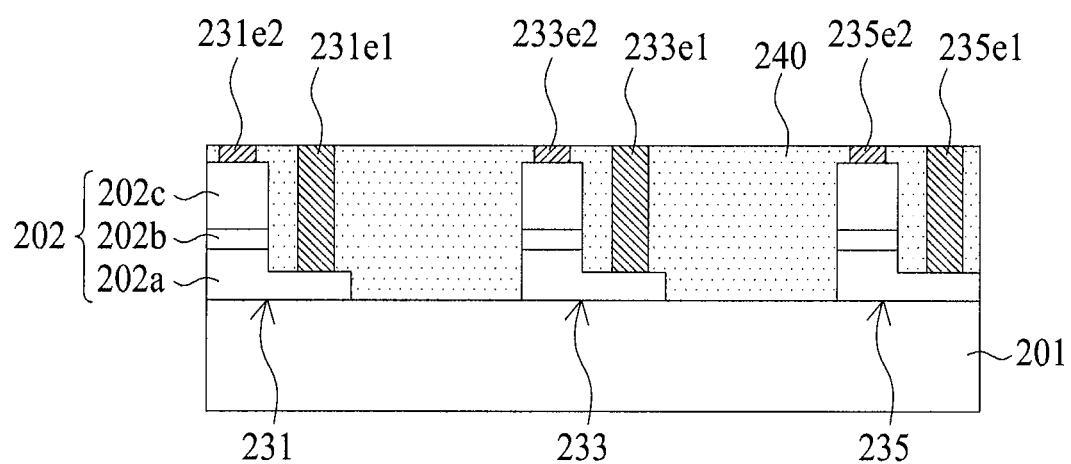
FIG. 2F shows an intermediate step of the method of manufacturing the light-emitting device in accordance with the first embodiment of the present disclosure.

As shown in FIG. 2F, it takes the first substrate 201 and the semiconductor stacked blocks 231, 233, 235 thereon for example to explain the method of manufacturing the light-emitting device of a first embodiment in the present disclosure. The method of manufacturing the light-emitting device following the method showing in FIGS. 2A-2E further comprises forming a first electrode 231e1 on the semiconductor stacked blocks 231 and 233 respectively to electrically connect to the first conductive-type semiconductor layers 202a of the semiconductor stacked blocks 231 and 233 correspondingly. The method further comprises forming a second electrode 231e2 on the semiconductor stacked blocks 231 and 233 respectively to electrically connect to the second conductive-type semiconductor layers 202c of the semiconductor stacked blocks 231 and 233 correspondingly. The procedure could comprise exposing the first conductive-type semiconductor layer 202a of each semiconductor stacked block (such as the semiconductor stacked blocks 231, 233 and so on) by an etching process, and then forming a dielectric layer 240 on the first substrate 201 and patterning the dielectric layer 240 to define the positions of the first electrode 231e1 and the second electrode 231e2 in the dielectric layer 240. Finally, the plurality of first electrodes 231e1 and the plurality of second electrodes 231e2 mentioned above are formed, for example, by filling a metal material in the positions of the first electrode 231e1 and the second electrodes 231e2 in the dielectric layer 240 by metal vapor deposition or electroplating. The redundant metal material above the dielectric layer 240 is then removed by chemical-mechanical polishing (CMP).

Figure 3A:
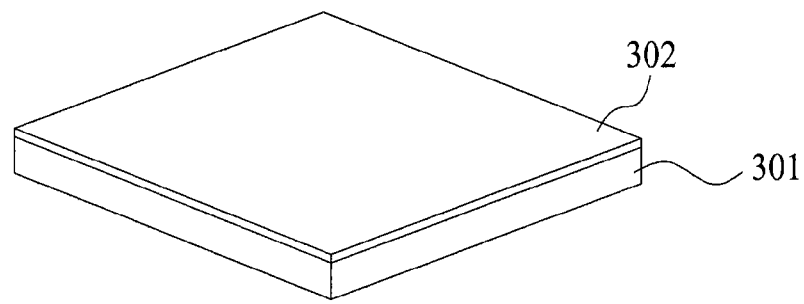
FIGS. 3A-3F show the method of manufacturing the light-emitting device in accordance with the first embodiment of the present disclosure (parallel connection).
Figure 3B:
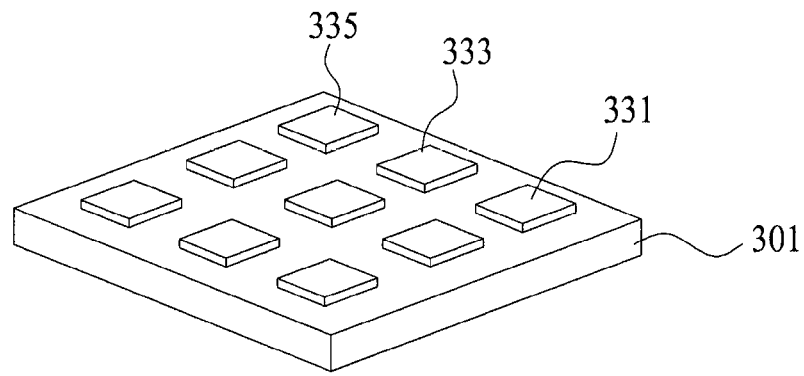
Figure 3C:
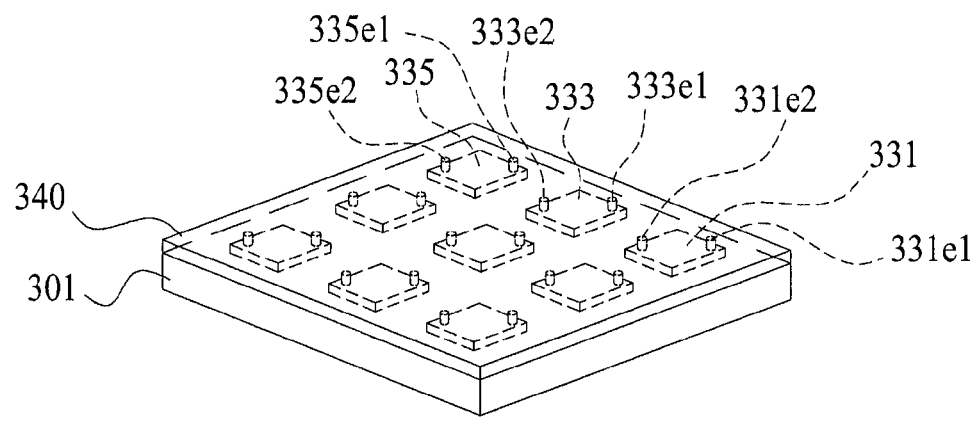

The structure and the material of the elements in FIGS. 3A-3C are similar to or the same as that in FIG. 2F, and as a result, the first number of element codes of the similar or same elements is changed from "2" to "3". FIG. 3A shows the first substrate 301 which is provided with a semiconductor stack 302 thereon, and FIG. 3B shows the semiconductor stacked blocks 331,333, and 335 keeping on the first substrate 301 after the above mentioned separating method of the semiconductor stack 302. Similarly, it should be noted that for concise explanation, the following description is based on the semiconductor stacked blocks 331 and 333. FIG. 3C shows the same result as FIG. 2F, which includes forming the dielectric layer 340, the plurality of first electrodes 331e1 and the plurality of second electrodes 331e2.

Figure 3D:
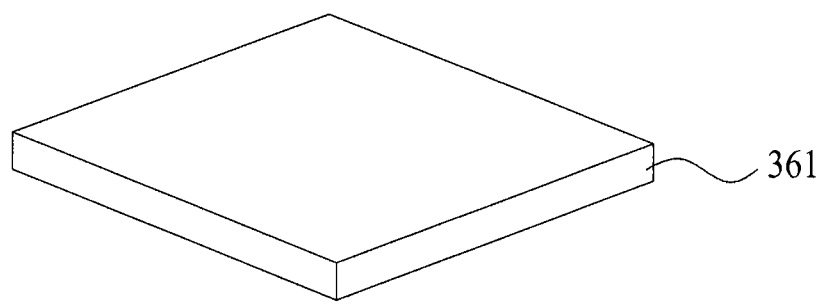
Figure 3E:
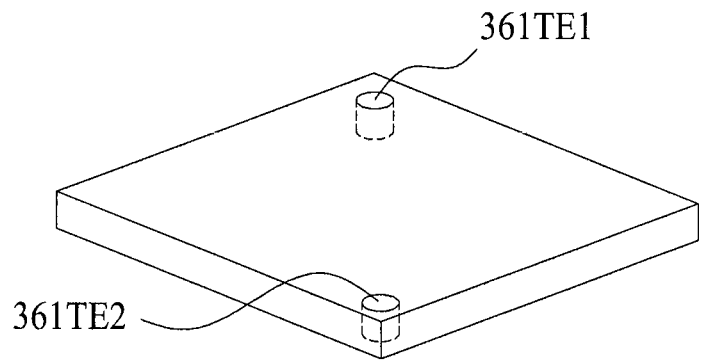
Figure 3F:
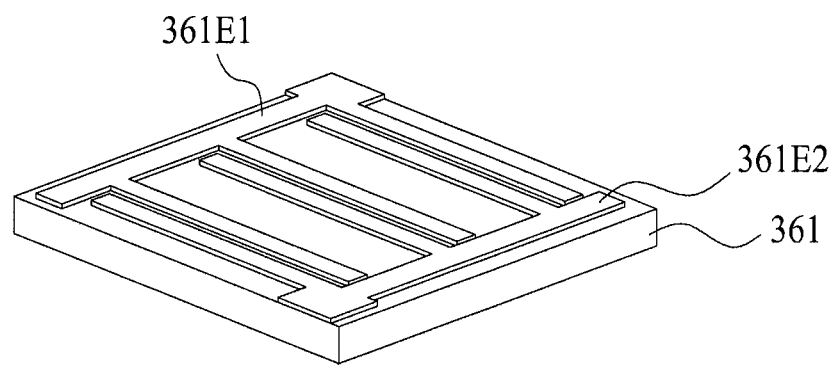

FIGS. 3D-3F show the method of manufacturing the element substrate designated to be bonded to the first substrate 301 in FIG. 3C in order to form light-emitting device as the final result in the embodiment. As shown in FIG. 3D, the element substrate 361 is provided and two via electrodes 361 TE1 and 361 TE2 are formed in the element substrate 361, wherein each of the via electrodes has a via and a conductive material filled therein. The two via electrodes 361TE1 and 361TE2 are designated to input an external power into the light-emitting device disclosed in the disclosure. As shown in FIG. 3F, patterned metal layers 361E1 and 361E2 are formed on the element substrate 361 to electrically connect to the two via electrodes 361TE1 and 361TE2 respectively, so that the plurality of semiconductor stacked blocks forms parallel connection. In other embodiment, the material of the patterned metal layer 361E1, 361E2 and the two via electrodes 361TE1, 631TE2 contain the same conductive material, that is, when the conductive material forms the patterned metal layers 361E1 and 361E2, the conductive material also fills in the via of two via electrodes 361TE1 and 361TE2.

FIGS. 4A-4D show the method of manufacturing the light-emitting device with the plurality of the semiconductor stacked blocks in parallel connection disclosed in the embodiment of the disclosure following what are shown in FIG. 3C and FIG. 3F. FIG. 4A is the first substrate 301 shown in FIG. 3C, and FIG. 4B shows a structure that the first substrate 301 is overturned with 180 degree. FIG. 4C is the element substrate 361 as shown in FIG. 3F. FIG. 4D shows the light-emitting device as the final result in the embodiment after bonding the first substrate 301 shown in FIG. 4B to the element substrate 361 shown in FIG. 4C. The top figure in FIG. 4D shows a partially enlarged image of FIG. 4D. As the partially enlarged image shown, the patterned metal layer 361E1 is bonded to the first electrodes 331e1 of the semiconductor stacked blocks 331, 333, and the patterned metal layer 361E2 is bonded to the second electrodes 331e2 of the semiconductor stacked blocks 331, 333 by the abovementioned aligned bonding. Therefore, the plurality of semiconductor stacked blocks, such as the semiconductor stacked blocks 331 and 333, have parallel connection.

FIGS. 5A-5D show the method of manufacturing the light-emitting device with the plurality of the semiconductor stacked blocks in series connection disclosed in the embodiment of the disclosure following what are shown in FIG. 3C and FIG. 3F. Similarly, FIG. 5A shows the structure with the first substrate 301 shown in FIG. 3C, and FIG. 5B shows a structure with the first substrate 301 overturned for 180 degree. FIG. 5C is the element substrate 361 with patterned metal layers 361S1, 361S2, 361S3 and 361S4 thereon, and two via electrodes 361TE1, 361TE2 designated to input an external power into the light-emitting device disclosed in the disclosure, are in the element substrate 361 and under the patterned metal layer 361S1, 362S2 respectively. FIG. 5D shows the light-emitting device as the final result in the embodiment after bonding the first substrate 301 shown in FIG. 5B to the element substrate 361 shown in FIG. 5C. The bottom figure in FIG. 5D shows a partially enlarged image of FIG. 5D. As the partially enlarged image shows, the patterned metal layers 361S1, 361S2, 361S3, and 361S4 are bonded to the first electrodes 331e1 and the second electrodes 331e2 of the semiconductor stacked blocks 331,333 and the other semiconductor stacked blocks of the plurality of semiconductor stacked blocks by the abovementioned aligned bonding. Therefore, the plurality of semiconductor stacked blocks, such as the semiconductor stacked blocks 331 and 333, has series connection.

Although the first embodiment mentioned above is based on FIG. 2F and taking the first substrate 201 and the semiconductor stacked blocks 231, 233 thereon for example, the second substrate 221 and the semiconductor stacked blocks 232, 234 thereon could also be applied in the method of manufacturing the light-emitting device in the embodiment of this disclosure, as mentioned in the paragraph which depicts FIG. 2E. As a result, the person having ordinary skill in the art could manufacture the similar or the same light-emitting device as the foregoing light-emitting device in the first embodiment according to the specification above, and the same description between the present embodiment and the previous embodiment is not described again.

Figure 6A:
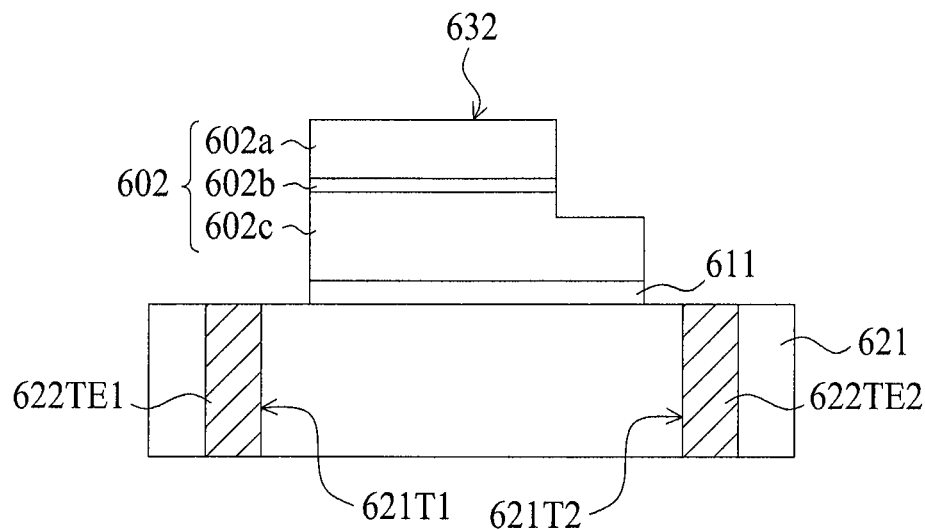
FIGS. 6A-6B show the method of manufacturing the light-emitting device in accordance with the second embodiment of the present disclosure.
Figure 6B:
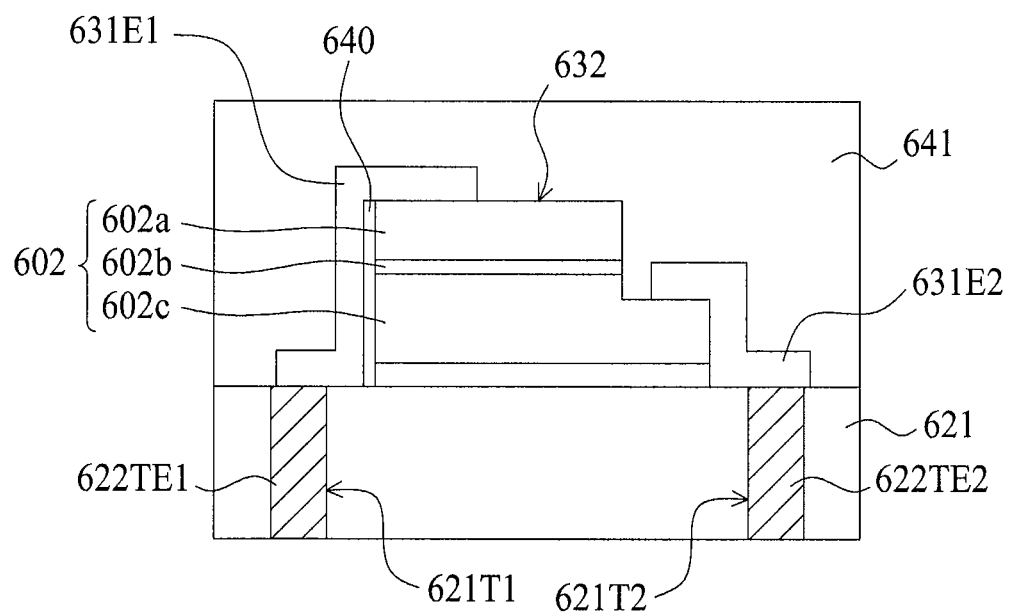

FIGS. 6A-6D show the method of manufacturing the light-emitting device disclosed in the second embodiment and the third embodiment of this disclosure. In the second embodiment, FIG. 6A and FIG. 6B show the method of manufacturing the light-emitting device when the second substrate in FIG. 2E is designated as the element substrate, and FIG. 6C and FIG. 6D, in the third embodiment, show the method of manufacturing the light-emitting device when another substrate is designated as the element substrate.

FIG. 6A is an embodiment based on the second substrate 221 and the semiconductor stacked block 232 thereon, which shown in FIG. 2E. It should be noted that the first numbers of element codes of the similar or same elements is changed from "2" in FIG. 2E to "6" in FIG. 6A, and the structure and the material of the elements in FIG. 6A is similar to or the same as that in FIG. 2E. However, the second substrate 621 further comprises a first via electrode 622TE1 and a second via electrode 622TE2, which is different from the second substrate 221 in FIG. 2E, wherein the first via electrode 622TE1 has a first via 621T1 in the second substrate 261 and a first conductive material filled therein, and the second via electrode 622TE2 has a second via 621T2 in the second substrate 261 and a second conductive material filled therein. In one embodiment, the first conductive material is the same as the second conductive material. Then, the semiconductor stack block 632 bonds to the second substrate 621 by an aligned bonding process in FIG. 6A and therefore the semiconductor stack 632 locates between the first via electrode 622TE1 and the second via electrode 622TE2 on the second substrate 621. After that, the semiconductor stack block 632 is partially etched to expose partial second conductive-type semiconductor layer 602c. As FIG. 6B shows, an insulating layer 640 is formed on the sidewall of the semiconductor stacked block 632 to provide electrical insulation between first conductive connecting line 631E1 which is formed in the following process and the semiconductor stacked block 632. Next, a first conductive connecting line 631E1 and a second conductive connecting line 631E2 are formed, wherein the first conductive connecting line 631E1 electrically connects the first conductive-type semiconductor layer 602a of the semiconductor stacked block 632 and the first via electrode 622TE1, and the second conductive connecting line 631E2 electrically connects the second conductive-type semiconductor layer 602c of the semiconductor stacked block 632 and the second via electrode 622TE2. Finally, a transparent encapsulated material 641 is formed on the second substrate 621 and covers the semiconductor stacked block 632, the first conductive connecting line 631E1, and the second conductive connecting line 631E2. In this way, the light-emitting device in the second embodiment is finished, wherein the first via electrode 622TE1 and the second via electrode 622TE2 are designated to input an external power into the light-emitting device disclosed in the disclosure.

Figure 6C:
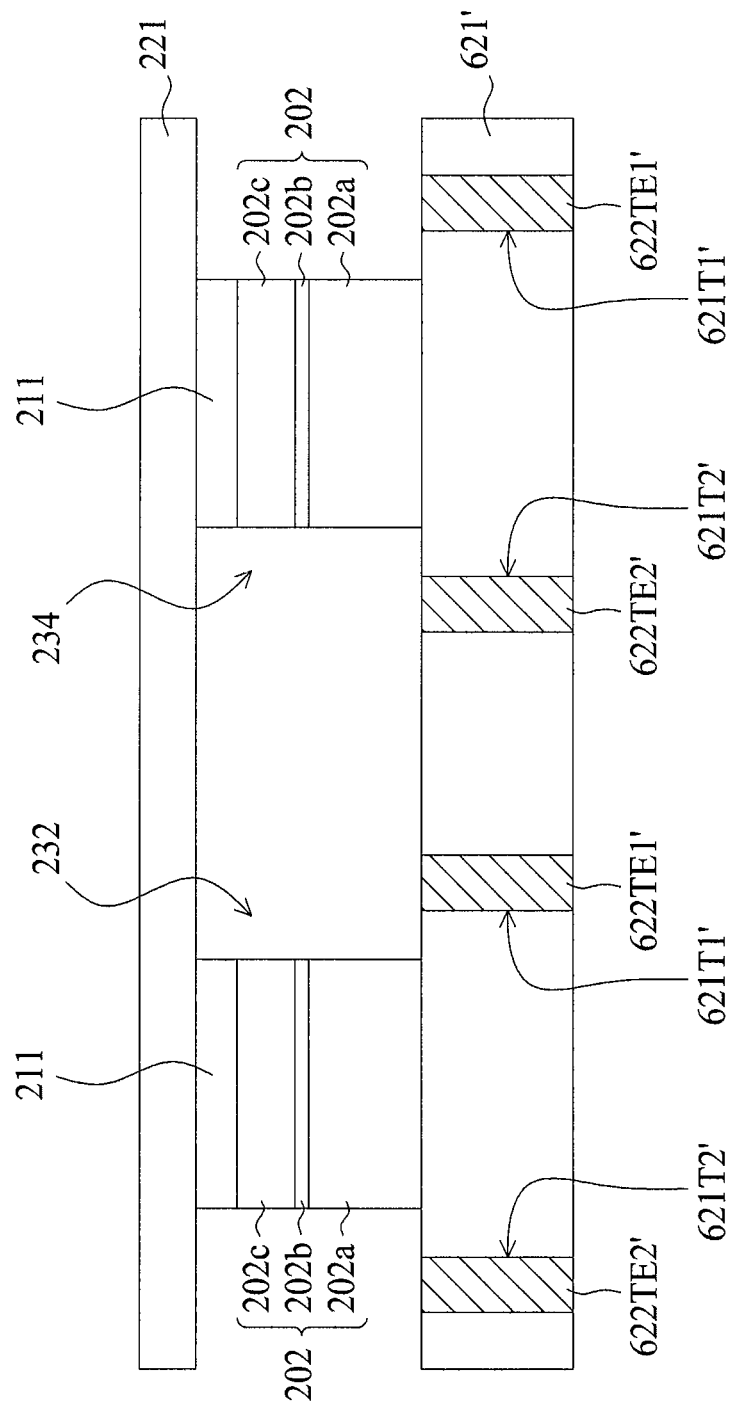
FIGS. 6C-6D show the method of manufacturing the light-emitting device in accordance with the third embodiment of the present disclosure.
Figure 6D:
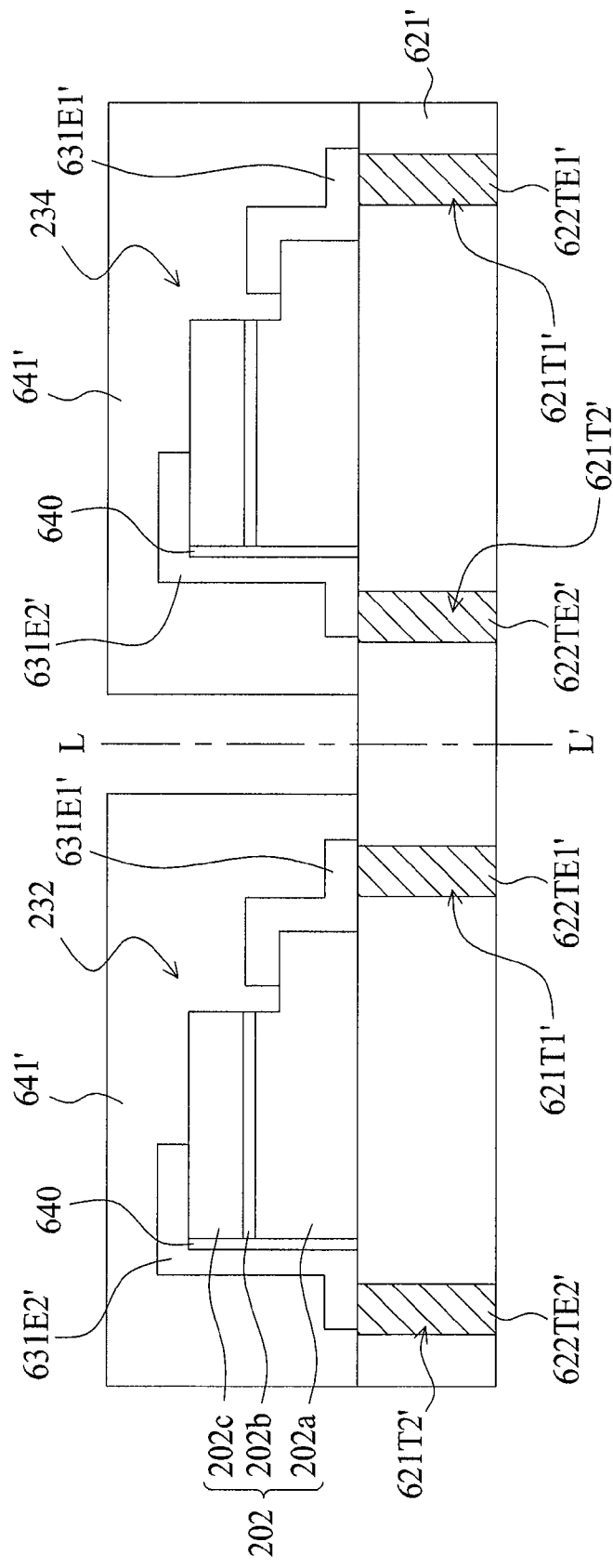

FIG. 6C and FIG. 6D show the method of manufacturing the light-emitting device when another substrate is designated as the element substrate. FIG. 6C is an embodiment based on the second substrate 221 and the semiconductor stacked blocks 232, 234 thereon. Although the plurality of semiconductor stacked blocks are utilized at the same time in the embodiment, such as the method of forming the plurality light-emitting devices by the semiconductor stacked blocks 232 and 234 and therefore two semiconductor stacked blocks 232 and 234 are shown in FIG, 6C, it could also choose the single semiconductor stacked block 232 (or semiconductor stacked block 234) utilized in the method. The second substrate 221 bonds to the semiconductor stacked block 232 (and/or the semiconductor stacked block 234), which are separated from the first substrate 201 by the foregoing separating process. The second substrate 221 is designated as a temporary substrate since the element substrate of the light-emitting device is another substrate in this embodiment. The method comprises providing an element substrate 621' which comprising a first via electrode 622TE1' and a second via electrode 622TE2'. It should be noted that the method of manufacturing the light-emitting device in the embodiment utilizes the plurality of the semiconductor stacked blocks at the same time, such as the semiconductor stacked block 232 and the semiconductor stacked block 234, to form a plurality of the light-emitting devices. Therefore, FIGS. 6C, 6D illustrate two sets of the first via electrode 622TE1' and the second via electrode 622TE2', and the two sets of the first via electrode 622TE1' and the second via electrode 622TE2' are for the semiconductor stacked block 232 and the semiconductor stacked block 234 respectively. The first via electrode 622TE1' has a first via 621T1' in the element substrate 621' and a first conductive material filled in the first via 261T1', and the second via electrode 622TE2' has a second via 621T2' in the element substrate 621' and a second conductive material filled in the second via 261T2'. In one embodiment, the first conductive material is the same as the second conductive material. Then, the semiconductor stack block 232 (and/or the semiconductor stack block 234) bonds to the element substrate 621' by an aligned bonding process, and therefore the semiconductor stack block 232 (and/or the semiconductor stack block 234) locates between the first via electrode 622TE1' and the second via electrode 622TE2' of the second substrate 621'. Next, the semiconductor stack block 232 (and/or the semiconductor stack block 234) is separated from the second substrate 221. Similarly, it is easier to separate the semiconductor stacked blocks 232 (and/or the semiconductor stack block 234) from the first sacrificial layer 211 by irradiating a laser to an interface between the semiconductor stacked blocks 232 (and/or the semiconductor stack block 234) and the first sacrificial layer 211.

Next, as FIG. 6D shows, the semiconductor stack 232 (and/or the semiconductor stack block 234) is partially etched to expose partial first-type semiconductor layer 202a of the semiconductor stack 232 (and/or the semiconductor stack block 234). Then, an insulating layer 640 is formed on the sidewall of the semiconductor stack 232 (and/or the semiconductor stack block 234) to provide electrical insulation between second conductive connecting line 631E2' which is formed in the following process and the semiconductor stacked block 232 (and/or the semiconductor stack block 234). After that, a first conductive connecting line 631E1' and a second conductive connecting line 631E2' are formed, wherein the first conductive connecting line 631E1' electrically connects the first conductive-type semiconductor layer 202a of the semiconductor stacked block 232 (and/or the semiconductor stack block 234) and the first via electrode 622TE1', and the second conductive connecting line 631E2' electrically connects the second conductive-type semiconductor layer 202c of the semiconductor stacked block 232 (and/or the semiconductor stack block 234) and the second via electrode 622TE2'. Finally, a transparent encapsulating material 641' is formed on the element substrate 621' and covers the semiconductor stacked block 232 (and/or the semiconductor stack block 234), the first conductive connecting line 631E1' and the second conductive connecting line 631E2'. In this way, the light-emitting device in the third embodiment of this disclosure is finished, wherein the first via electrode 622TE1' and the second via electrode 622TE2' are designated to input an external power into the light-emitting device in the disclosure. The method of manufacturing the light-emitting device in one embodiment further comprises cutting along the L-L' line (as shown in FIG. 6D) to separate the semiconductor stacked block 232 and the semiconductor stacked block 234 and produce the plurality of light-emitting devices.

Although the above mentioned second and the third embodiments take the second substrate 221 and the semiconductor stacked blocks 232, 234 thereon for example, the first substrate 201 and the semiconductor stacked blocks 231, 233 on the first substrate 201 could also be used in the method of manufacturing the light-emitting device in the embodiment of this disclosure, as mentioned in the paragraph which depicts FIG. 2E. As a result, the person having ordinary skill in the art could manufacture the light-emitting device which is similar to or the same as that in the second embodiment or the third embodiment according to the above specification, and the same description between the present embodiment and the previous embodiment is not described again.

FIGS. 7A-7G show the fourth embodiment of the method of manufacturing light-emitting device following the separating method as shown in FIGS. 2A-2E. The method disclosed in the fourth embodiment takes the second substrate 221 and the semiconductor stacked block 232 (and/or the semiconductor stacked block 234) thereon, and the first substrate 201 and the semiconductor stacked block 231 (and/or the semiconductor stacked block 233) thereon shown in FIG. 2E for example.

Figure 7A:
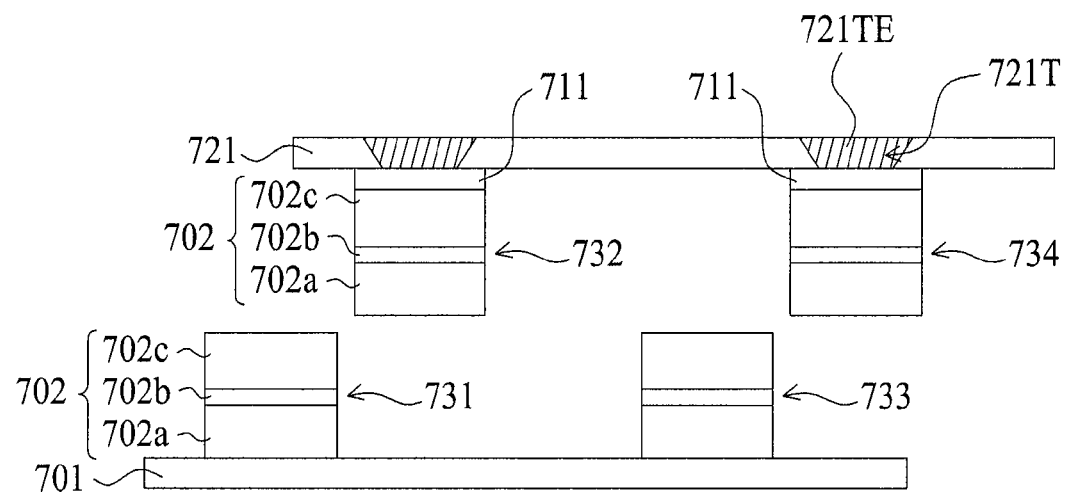
FIGS. 7A-7G show the method of manufacturing the light-emitting device in accordance with the fourth embodiment of the present disclosure.
Figure 7B:
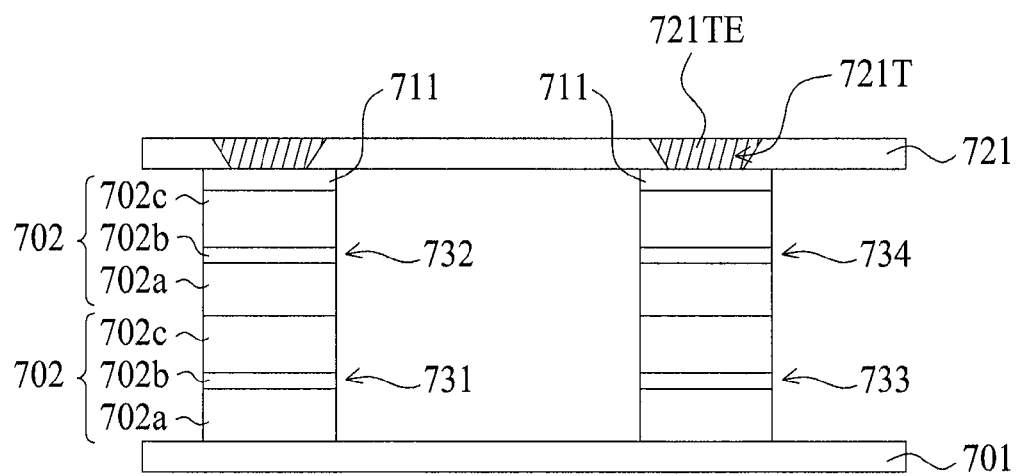

It should be explained that the structure and the material of the elements in FIG. 7A are similar to or the same as that disclosed in FIG. 2E, as a result, the first number of element codes of the similar or the same elements is changed from "2" in FIG. 2E to "7" in FIG. 7A. The second substrate 721 further comprises a first via electrode 721TE, wherein the first via electrode 721TE has a first via 721T in the second substrate 721 and a first conductive material filled in the first via 721T. Moreover, the first substrate 721 bonds and aligns with the first sacrificial layer 711 in order to electrically connecting the semiconductor stacked block 732 (and/or the semiconductor stacked block 734) with the first via electrode 721TE. As shown in FIG. 7A, the semiconductor stacked block 732 (and/or the semiconductor stacked block 734), which is separated from the first substrate 701 by the separating process, is on the second substrate 721, and the semiconductor stacked block 731 (and/or the semiconductor stacked block 733) keeps on the first substrate 701 after the separating process. Next, the semiconductor stacked block 732 (and/or the semiconductor stacked block 734) bonds and aligns with the semiconductor stacked block 731 (and/or the semiconductor stacked block 733) by a second bonding step, as shown in FIG. 7B. It should be noted that the embodiment also shows the method of manufacturing the plurality of light-emitting devices at the same time, and therefore there are two sets of bonded semiconductor stacked block shown in the embodiment. More specifically, one set of bonded semiconductor stack are formed by bonding the semiconductor stacked block to the semiconductor stacked block 731, and other set of bonded semiconductor stack are formed by bonding the semiconductor stacked block 734 to the semiconductor stacked block 733. However, the method comprises utilizing each one of the two sets or the two sets at the same time. (The latter should be cut to form a plurality of light-emitting devices and is not described again).

Figure 7C:
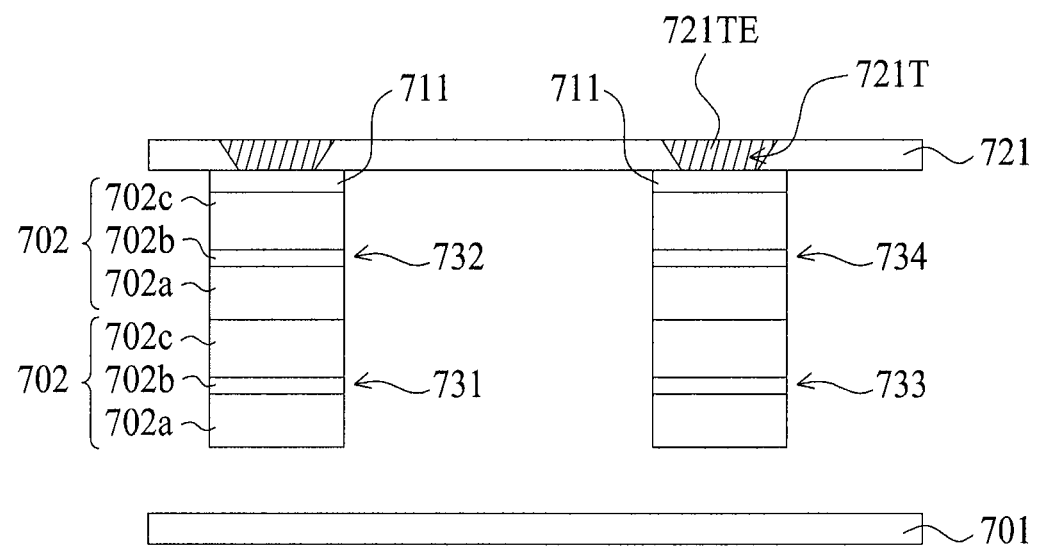
Figure 7D:
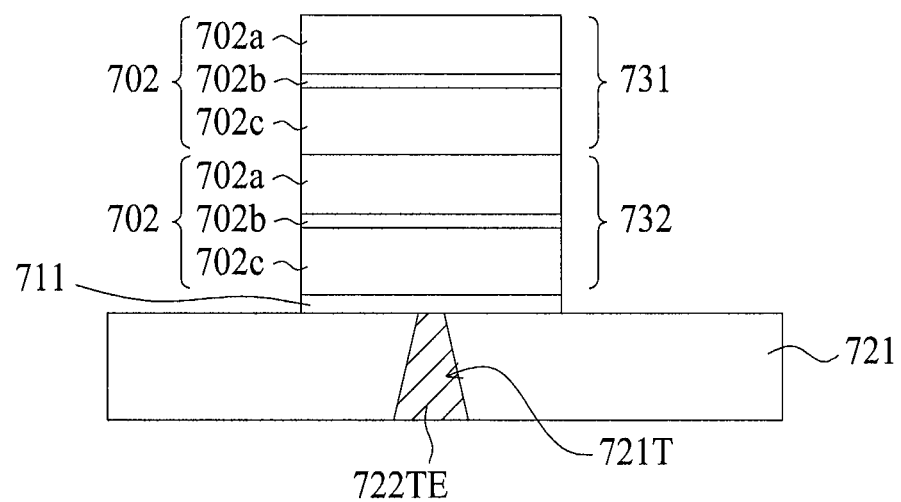
Figure 7E:
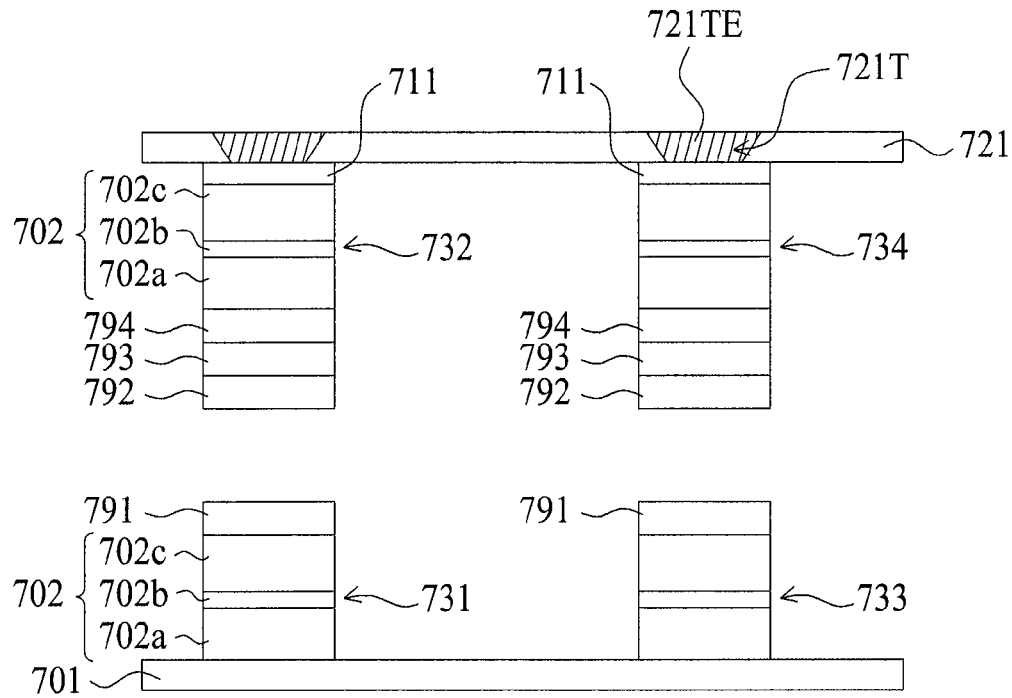
Figure 7F:
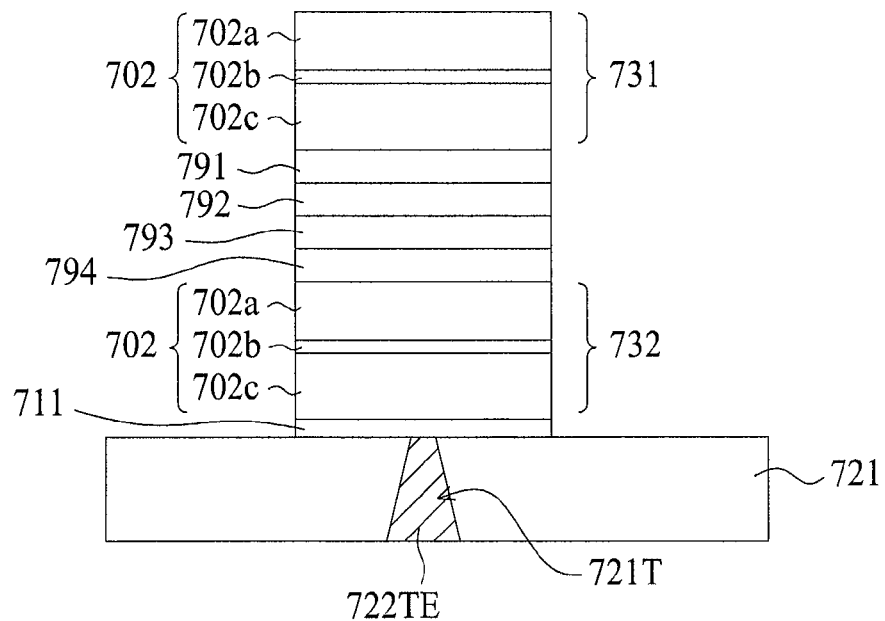

Then, the semiconductor stacked block 731 (and/or the semiconductor stacked block 733) is separated from the first substrate 701, as shown in FIG. 7C. FIG. 7D shows the structure after overturning FIG. 7C for 180 degree. It should be explained that FIG. 7D only illustrates a structure after bonding one set of the semiconductor stacked blocks for concise explanation. Besides, as shown in FIG. 7E, before the second bonding process, a conductive oxide layers 791 and 792 are selectively formed on the semiconductor stacked block 731 (and/or the semiconductor stacked block 733) and the semiconductor stacked block 732 (and/or the semiconductor stacked block 734) respectively. The conductive oxide layer 791 or 792 could form ohmic contact with the semiconductor stacked block and/or could be a bonding layer. The conductive oxide layers 791 and 792 could be, for example, indium oxide (InO), tin oxide (SnO), cadmium tin oxide (CTO), antimony tin oxide (ATO), or zinc oxide (ZnO). In this embodiment, both of the conductive oxide layer 791 and the conductive oxide layer 792 are designated as the bonding layer, while the conductive oxide layer 791 could also form ohmic contact with the semiconductor stacked block 731 (and/or the semiconductor stacked block 733). Moreover, a metal layer is selectively formed on at least one of the semiconductor stacked block 731 (and/or the semiconductor stacked block 733) and the semiconductor stacked block 732 (and/or the semiconductor stacked block 734). The metal layer could form ohmic contact with semiconductor stacked block and/or provide a function of reflecting. As shown in FIG. 7E, an ohmic contact metal layer 794 and a reflective metal layer 793 are formed on the semiconductor stacked block 732 (and/or the semiconductor stacked block 734) before forming the conductive oxide layer 792 on the semiconductor stacked block 732 (and/or the semiconductor stacked block 734). The ohmic contact metal layer 794 ohmically contacts with the semiconductor stacked block 732 (and/or the semiconductor stacked block 734), and the material of the ohmic contact metal layer 794 could be GeAu. The reflective metal layer 793 acts as a reflecting mirror, and the material of the reflective metal layer 793 could be Ag. Besides, the ohmic contact metal layer 794 and the reflective metal layer 793 could be metal or alloy, and the metal could be Al, Au, Ge, Pt, Zn, Ag, Ni, In, Sn, Ti, Pb, Cu, Pd, while the alloy could be the alloy containing more than one of the foregoing metals. The semiconductor stacked block 731 (and/or the semiconductor stacked block 733) bonds to the semiconductor stacked block 732 (and/or the semiconductor stacked block 734) through the conductive oxide layers 791 and 792. FIG. 7F shows an overturned structure disclosed in FIG. 7E after removing the first substrate 701. Similarly, for concise explanation, it is only illustrated the structure of bonding one set of the semiconductor stacked blocks in FIG. 7F.

Figure 7G:
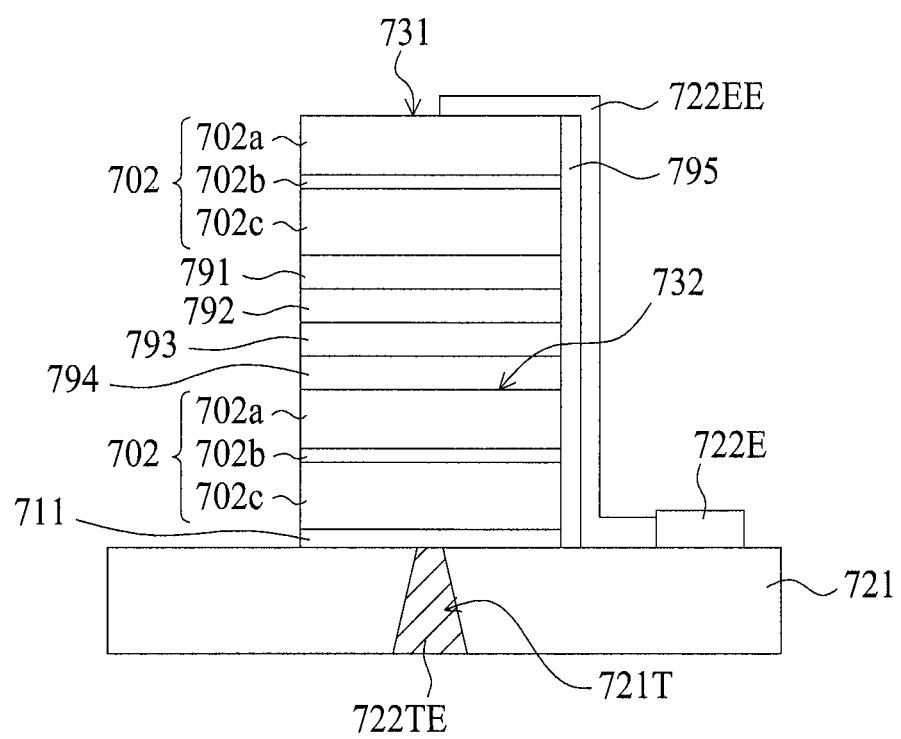
Figure 7H:
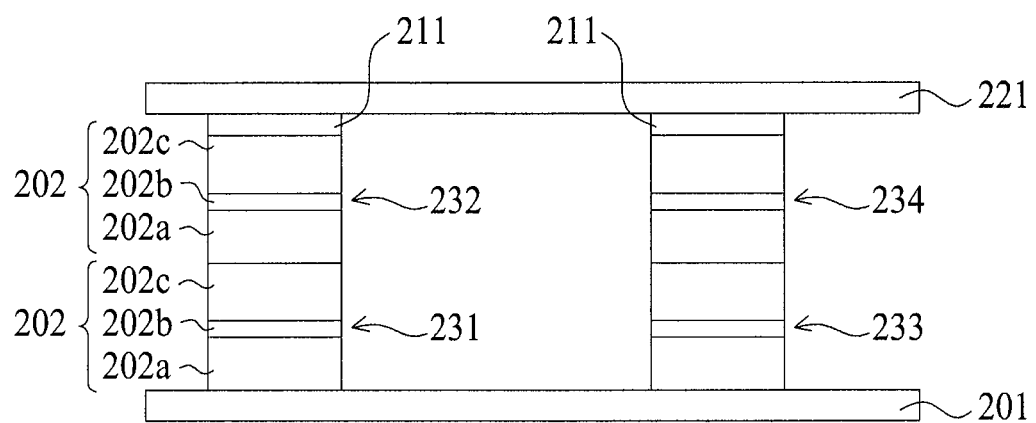
FIGS. 7H-7K show the method of manufacturing the light-emitting device in accordance with the fifth embodiment of the present disclosure.

Next, FIG. 7G follows FIG. 7F for further description. It should be noted that in other embodiment, the structure shown in FIG. 7D could also be utilized in the present embodiment. An insulating layer 795 is formed on the sidewall of the semiconductor stacked block 731, 732, as shown in FIG. 7G. Then, an electrode 722EE and an electrode 722E form on the second substrate 721 and electrically connect to the first conductive-type semiconductor layer 702a. The insulating layer 795 electrically insulates the electrodes 722EE and 722E with the semiconductor stacked block 731 and the semiconductor stacked block 732. In this way, the light-emitting device in the fourth embodiment is finished. The light-emitting device comprises the semiconductor stacked block 731 and the semiconductor stacked block 732 to form a dual-junction light-emitting device. The electrodes 722EE, 722E and the first via electrode 721TE could input an external power into the light-emitting device in this disclosure.

Figure 7I:
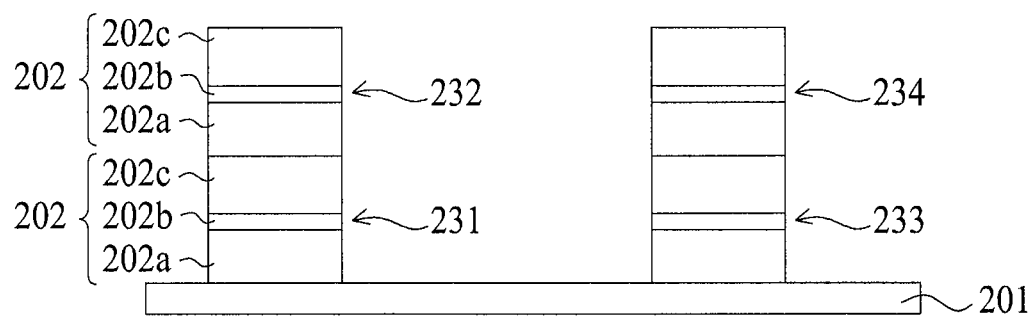
Figure 7J:
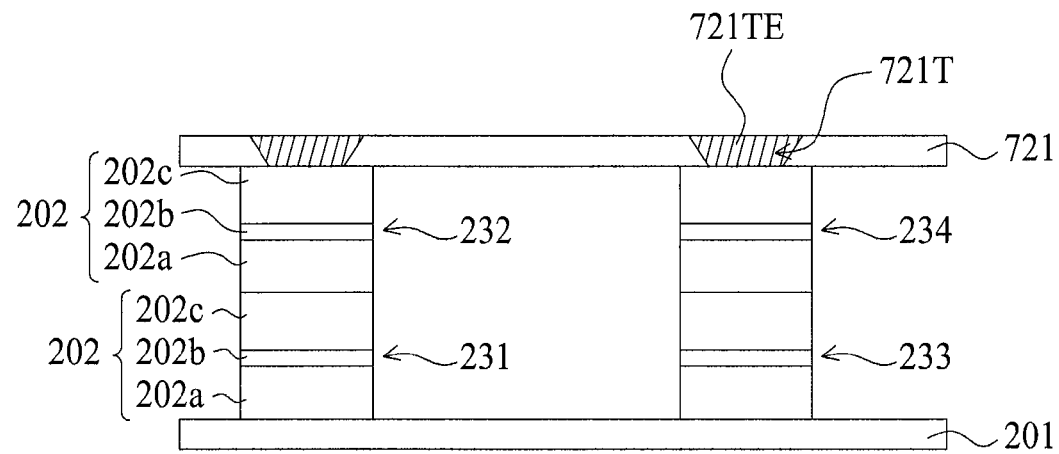
Figure 7K:
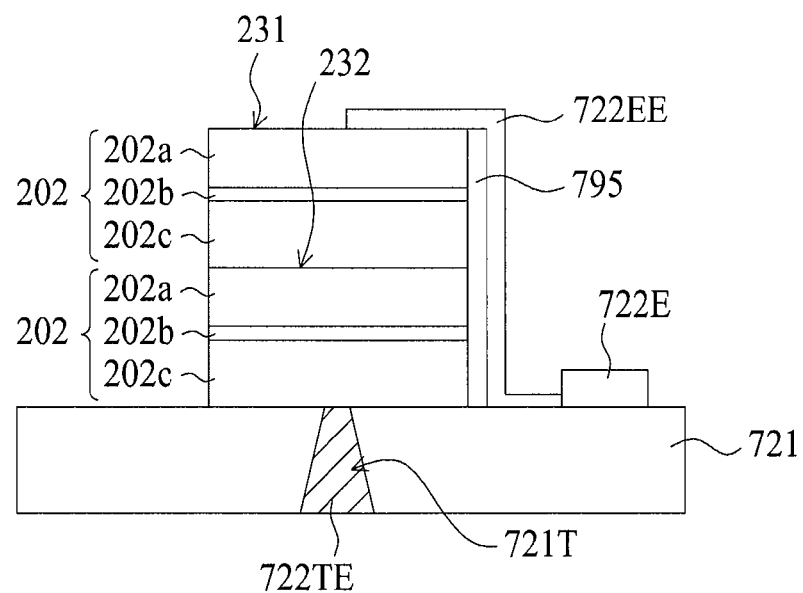

FIGS. 7H-7K show the fifth embodiment of the method of manufacturing the light-emitting device in the disclosure. The fifth embodiment is a transformation of the fourth embodiment mentioned above. In this embodiment, the semiconductor stacked block 232 (and/or the semiconductor stacked block 234) on the second substrate 221 in FIG. 2E bonds to and aligns with the semiconductor stacked block 231 (and/or the semiconductor stacked block 232) on the first substrate 201 by a second bonding step shown in FIG. 7H after the separating method mentioned in FIGS. 2A-2E. Next, as shown in FIG. 7I, the semiconductor stacked block 132 (and/or the semiconductor stacked block 234) is separated from the second substrate 221. Then, an element substrate which designated as an element substrate of the light-emitting device could bond to the semiconductor stacked block 232 (and/or the semiconductor stacked block 234). In another embedment, a first substrate 201 could also be removed so that the semiconductor stacked block 231 (and/or the semiconductor stacked block 233) is separated from the first substrate 201, and the element substrate bonds to the semiconductor stacked block 231 (and/or the semiconductor stacked block 233). After that, in FIG. 7J, a second substrate 721 is provided to be designated as an element substrate of the light-emitting device. The second substrate 721 comprises a first via electrode 721TE having a first via 721T and a first conductive material filled in the first via 721T. Next, the semiconductor stacked block 232 (and/or the semiconductor stacked block 234) bonds and aligns with the second substrate 721 by a third bonding step, so that the semiconductor stacked block 232 (and/or the semiconductor stacked block 234) electrically connects to the first via electrode 721TE of the second substrate 721, as shown in FIG. 7J. Finally, the semiconductor stacked block 231 (and/or the semiconductor stacked block 233) is separated from the first substrate 201 and the insulating layer 795 and the electrodes 722EE, 722E are formed, which are like the same way shown in FIG. 7G. Therefore, the light-emitting device shown in FIG. 7K is produced. It should be noted that conductive oxide layers are selectively formed on the semiconductor stacked block 231 (and/or the semiconductor stacked block 233) and the semiconductor stacked block 232 (and/or the semiconductor stacked block 234) respectively before the aligned bonding process in the second bonding step, when the semiconductor stacked block 232 (and/or the semiconductor stacked block 234) bonds and aligns with semiconductor stacked block 231 (and/or the semiconductor stacked block 233). Besides, a metal layer could also be selectively formed on at least one of the semiconductor stacked block 231 (and/or the semiconductor stacked block 233) and the semiconductor stacked block 232 (and/or the semiconductor stacked block 234). The detail specification is already mentioned above and is not described again. Furthermore, as mentioned in FIG. 7I, in other embodiment, the semiconductor stacked block 231 (and/or the semiconductor stacked block 233) could be separated from the first substrate 201, and the first substrate 201 is removed. The semiconductor stacked block 231 (and/or the semiconductor stacked block 233) bonds and aligns with the second substrate 721 in the third bonding step shown in FIG. 7J, and then the semiconductor stacked block 232 (and/or the semiconductor stacked block 234) is separated from the second substrate 221.

In the various embodiments mentioned above, it should be noted that, although the elements with the same function have different codes in different embodiments, they should be regarded as having the same or similar characters, such as physical, chemical or electrical characters unless there is a limitation in each embodiment, and it is not necessary to repeatedly describe in every embodiments.

It should be noted that the proposed various embodiments are not for the purpose to limit the scope of the disclosure. Any possible modifications without departing from the spirit of the disclosure may be made and should be covered by the disclosure. The range of the protective right is defined by the following claims.

What is claimed is:

1. A method of manufacturing a light-emitting device, which comprises:
   providing a first substrate and a plurality of semiconductor stacked blocks comprising a first semiconductor stacked block and a second semiconductor stacked block on the first substrate, and each of the plurality semiconductor stacked blocks comprises a first conductive-type semiconductor layer, a light-emitting layer on the first conductive-type semiconductor layer, and a second conductive-type semiconductor layer on the light-emitting layer; and
   conducting a first separating step comprises:
   providing a second substrate;
   conducting a first bonding step to bond the first semiconductor stacked block to the second substrate;
   separating the first semiconductor stacked block from the first substrate and keeping a second semiconductor stacked block on the first substrate; and
   conducting a second bonding step to bond and align the first semiconductor stacked block with the second semiconductor stacked block.

2. The method of manufacturing a light-emitting device of claim 1, further comprises separating the first semiconductor stacked block from the second substrate.

3. The method of manufacturing a light-emitting device of claim 2, further comprises:
   providing a third substrate;
   conducting a third bonding step to bond and align the first semiconductor stacked block with the third substrate; and
   separating the second semiconductor stacked block from the first substrate.

4. The method of manufacturing a light-emitting device of claim 3, wherein the third substrate further comprises a first electrode before conducting the third bonding step, and the first semiconductor stacked block aligns with the first electrode and forms electrical connection with the first electrode in the third bonding step.

5. The method of manufacturing a light-emitting device of claim 4, further comprises forming a second electrode on the third substrate, and the second electrode electrically connect to the second semiconductor stacked block.

6. The method of manufacturing a light-emitting device of claim 4, wherein the third substrate comprises a via, and the first electrode is formed by filling a conductive material in the via.

7. The method of manufacturing a light-emitting device of claim 4, wherein the first electrode comprise a first end connecting to the first semiconductor stacked block and a second end opposite to the first end, and the first end has an area different from that of the second end from a cross section of the light emitting device.

8. The method of manufacturing a light-emitting device of claim 5, further comprises forming an insulating layer on a sidewall of the semiconductor stacked blocks, and the second electrode covers the insulating layer.

9. The method of manufacturing a light-emitting device of claim 1, further comprises forming a first sacrificial layer on the first semiconductor stacked block before the first bonding step.

10. The method of manufacturing a light-emitting device of claim 9, wherein the first sacrificial layer is formed by forming a layer of a material of the first sacrificial layer on the surfaces of the plurality of the semiconductor stacked blocks, and then selectively removing the material of the first sacrificial layer.

11. The method of manufacturing a light-emitting device of claim 9, wherein the first sacrificial layer comprises conductive material.

12. The method of manufacturing a light-emitting device of claim 9, wherein the first sacrificial layer comprises metal oxide.

13. The method of manufacturing a light-emitting device of claim 1, further comprises separating the second semiconductor stacked block from the first substrate.

14. The method of manufacturing a light-emitting device of claim 13, further comprises forming a second electrode on the second substrate after the second bonding step.

15. The method of manufacturing a light-emitting device of claim 1, wherein the second substrate comprises a first electrode.

16. The method of manufacturing a light-emitting device of claim 15, wherein the first bonding step comprises aligning and bonding the first semiconductor stacked block with the first electrode of the second substrate in order to form electrical connection between the first electrode and the first semiconductor stacked block.

17. The method of manufacturing a light-emitting device of claim 15, wherein the second substrate comprises a via, and the first electrode is formed by filling a conductive material in the via.

18. The method of manufacturing a light-emitting device of claim 1, further comprises forming a conductive oxide layer on the first semiconductor stacked block and/ or the second semiconductor stacked block before the second bonding step.

19. The method of manufacturing a light-emitting device of claim 1, further comprises forming a metal layer on at least one of the first semiconductor stacked block and/ or the second semiconductor stacked block before the second bonding step.

20. The method of manufacturing a light-emitting device of claim 1, further comprising forming a second electrode on the second semiconductor stacked block after the second bonding step.

\* \* \* \* \*